United States Patent
Agarwal et al.

(10) Patent No.: US 12,323,106 B2
(45) Date of Patent: *Jun. 3, 2025

(54) HIGH QUIESCENT CURRENT CONTROL

(71) Applicant: TEXAS INSTRUMENTS INCORPORATED, Dallas, TX (US)

(72) Inventors: Nitin Agarwal, Bangalore (IN); Aniruddha Roy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 54 days.

This patent is subject to a terminal disclaimer.

(21) Appl. No.: 18/298,626

(22) Filed: Apr. 11, 2023

(65) Prior Publication Data

US 2023/0246595 A1    Aug. 3, 2023

Related U.S. Application Data

(63) Continuation of application No. 17/136,427, filed on Dec. 29, 2020, now Pat. No. 11,626,841.

(30) Foreign Application Priority Data

Jul. 10, 2020    (IN) .............................. 202041029269

(51) Int. Cl.
*H03F 1/02* (2006.01)
*H03F 1/32* (2006.01)

(52) U.S. Cl.
CPC ......... *H03F 1/0233* (2013.01); *H03F 1/3205* (2013.01); *H03F 2200/504* (2013.01)

(58) Field of Classification Search
CPC ............... H03F 1/0233; H03F 1/3205; H03F 2200/504; H03F 3/3028

USPC ........................................... 330/277, 252–261
See application file for complete search history.

(56) References Cited

U.S. PATENT DOCUMENTS

| | | | |
|---|---|---|---|
| 6,366,169 B1 | 4/2002 | Ivanov | |
| 6,828,855 B1 | 12/2004 | Wang | |
| 7,342,450 B2 | 3/2008 | Jones | |
| 7,528,633 B2 * | 5/2009 | Jung | ...... H03F 3/345 327/51 |

(Continued)

FOREIGN PATENT DOCUMENTS

CN    110401424 A    11/2019

OTHER PUBLICATIONS

European Search Report, European Patent Application No. 21838380. 0, 13 pages.

(Continued)

*Primary Examiner* — Hieu P Nguyen
(74) *Attorney, Agent, or Firm* — Michael T. Gabrik; Frank D. Cimino

(57) ABSTRACT

A circuit is provided. In some examples, the circuit includes a first transistor having a gate and a drain coupled together and a current source coupled to the drain of the first transistor. A second transistor has a drain coupled to a source of the first transistor. A third transistor has a gate coupled to the gate of the first transistor. A fourth transistor has a drain coupled to a source of the third transistor and a gate of the fourth transistor is coupled to a gate of the second transistor. In some examples, the third transistor is configured to limit a first current between the third transistor and the fourth transistor based on an output voltage.

20 Claims, 4 Drawing Sheets

(56) References Cited

U.S. PATENT DOCUMENTS

| | | |
|---|---|---|
| 7,557,658 B2 | 7/2009 | Perez |
| 7,688,136 B2 | 3/2010 | Langer et al. |
| 8,536,947 B2 | 9/2013 | Wang et al. |
| 9,130,560 B2 | 9/2015 | Shook |
| 10,250,199 B2 | 4/2019 | Klaren et al. |
| 10,536,117 B1 | 1/2020 | Far |
| 2007/0115741 A1 | 5/2007 | Jung et al. |
| 2007/0200629 A1 | 8/2007 | Perez |

OTHER PUBLICATIONS

International Search Report dated Oct. 14, 2021, PCT Application No. PCT/US2021/041273, 3 pages.
Written Opinion dated Oct. 14, 2021, PCT Application No. PCT/US2021/041273, 5 pages.
Klaas-Jan de Langen and Johan H. Huijsing, "Compact Low-Voltage Power-Efficient Operational Amplifier Cells for VLSI", IEEE Journal of Solid-State Circuits, vol. 33 No. 10,. Oct. 1998, pp. 1-15.

\* cited by examiner

HIGH QUIESCENT CURRENT CONTROL

CROSS-REFERENCE TO RELATED APPLICATION(S)

This application is a continuation of U.S. patent application Ser. No. 17/136,427 filed Dec. 29, 2020, which also claims priority to Indian Application No. 202041029269 filed Jul. 10, 2020, all of which are incorporated herein by reference in their entirety.

BACKGROUND

There are several different classes of amplifiers, including class A, B, and AB (or "A/B"). A class A amplifier reproduces an entire input signal by keeping a single active element, such as a transistor, powered on for the entire 360° cycle of the input waveform. As a result, class A amplifiers may have high power consumption.

A class B amplifier uses two active elements, such as two transistors. Each transistor is turned on for 180° of the input waveform. For example, the first transistor is on for 0° to 180° of the input waveform and off for 181° to 360° of the input waveform. The second transistor would then be turned off for 0° to 180° of the input waveform and on for 181° to 360° of the input waveform. That is, one output transistor operates as a current source, and the other output transistor operates as a current sink. This configuration may be referred to as a "push-pull" configuration because a first branch of the output stage "pushes" or sources currents to a load while a second branch of the output stage "pulls" or sinks current from the load. A class B amplifier has lower power consumption than a class A amplifier, but a class B amplifier may be susceptible to crossover distortion due to the turn-on of one output transistor not matching the turn-off of the other output transistor.

A class AB amplifier combines characteristics from both class A and class B amplifiers. Class AB amplifiers avoid the high power consumption of a class A amplifier by employing two transistors like class B amplifiers. To avoid the crossover distortion, class AB amplifiers bias both transistors into slight conduction, even when no input signal is present. This small biasing arrangement ensures that both transistors conduct simultaneously during a very small part of the input waveform by more than 50 percent of the input cycle, but less than 100 percent.

Low voltage class AB operational amplifiers (Op-Amp) may include a current feedback loop to facilitate class AB control. Current feedback is based on the current from the output transistors, and to determine the amount of current, transistors (sometimes referred to as "measuring transistors") may be used that sense the current from the respective output transistors. These sense transistors that sense the current may be coupled in such a way that a current sense branch forms in the Op-Amp.

When the output transistors operate outside the linear range, this may cause the current in the current sense branch to increase much beyond the typical value, even in the no load scenario. This is because the Op-Amp current feedback loop becomes dysfunctional outside the linear range. In an Op-Amp having N-MOS and P-MOS transistors, the current feedback loop can be associated with either the N-MOS transistors or the P-MOS transistors of the Op-Amp.

When the current feedback loop is associated with the N-MOS transistors of the Op-Amp, a high quiescent current occurs in the sense branch of the Op-Amp as the output common mode approaches ground. This occurs because when the amplifier output is close to ground, the gain of the Op-Amp is low, and the voltage on the gates of the one or more output transistors approaches the positive supply rail. This causes the current in the sense branch in the Op-Amp to go high.

When the current feedback loop is associated with the P-MOS transistors of the Op-Amp, a high quiescent current occurs in the sense branch of the Op-Amp as the output common mode approaches a positive supply rail. This occurs because when the amplifier output is close to the positive supply rail, the gain of the Op-Amp is low, and the voltage on the gates of the one or more output transistors approaches ground. This causes the current in the sense branch of the Op-Amp to go high.

A high current in the current sense branch in a low voltage class AB OP-Amp is, for example, inefficient, and it creates excess heat. These shortcomings, among others, are magnified in applications that use numerous Op-Amps.

SUMMARY

In some examples, a circuit is provided to limit a quiescent current on the current sense branch of the current feedback loop for a class AB Op-Amp when the output of the Op-Amp is close to or at the supply/ground rails. When the output of the Op-Amp is close to or at the supply/ground rails, the current sense branch associated with one or more of the output transistors may go high. A transistor may be used to limit the current in the sense branch based on the output voltage of the Op-Amp. To do this, a voltage clamp may bias the current limiting transistor, and the voltage clamp may adjust the bias to the current limiting transistor based on the output voltage to which the voltage clamp is coupled.

In some examples, a circuit is provided that comprises a first transistor having a gate and a drain coupled together. The circuit further comprises a current source coupled to the drain of the first transistor. The circuit further comprises a second transistor having a drain coupled to a source of the first transistor. The circuit further comprises a third transistor having a gate coupled to the gate of the first transistor. The circuit further comprises a fourth transistor having a drain coupled to a source of the third transistor and a gate of the fourth transistor is coupled to a gate of the second transistor.

In some examples, an electronic device comprises a current source. The electronic device further comprises a first transistor coupled to the current source and an output voltage. The electronic device further comprises a second transistor coupled to the first transistor. The electronic device further comprises a third transistor coupled to the first transistor, wherein the first transistor is configured to bias the third transistor based on the output voltage and the current source. The electronic device further comprises a fourth transistor coupled to the second transistor and the fourth transistor coupled in series with the third transistor, wherein the third transistor is configured to limit a first current between the third transistor and the fourth transistor based on the output voltage.

In some examples, an amplifier comprises an input stage configured to receive an input voltage signal and to provide a drive signal. The amplifier further comprises an amplifier stage configured to receive the drive signal and to provide an amplified signal in response to a bias signal and the drive signal. The amplifier further comprises an output stage configured to receive the amplified signal and provide an output voltage. The amplifier further comprising a control circuit coupled to the amplifier stage and the output stage, the control circuit configured to provide the bias signal to the amplifier stage. The control circuit includes a current source. The control circuit further includes a voltage sensor coupled to the current source, the voltage sensor configured to sense the output voltage. The control circuit further includes a current limiter coupled to the voltage sensor, the current limiter configured to limit a first current based on the output voltage.

BRIEF DESCRIPTION OF THE DRAWINGS

Features of the present disclosure may be understood from the following detailed description and the accompanying drawings.

DETAILED DESCRIPTION

Specific examples are described below in detail with reference to the accompanying figures. It is understood that these examples are not intended to be limiting, and unless otherwise noted, no feature is required for any particular example.

The embodiments of the present disclosure may be implemented as a circuit, integrated circuit, or other suitable configuration. The present disclosure may be implemented separately or integral with an Op-Amp. For example, an Op-Amp may be an integrated circuit, and the present disclosure may be incorporated in the integrated circuit of the Op-Amp to improve the Op-Amp.

Of course, these advantages are merely examples, and no advantage is required for any particular embodiment. Examples of the present disclosure are described with reference to the figures below.

Figure 1:
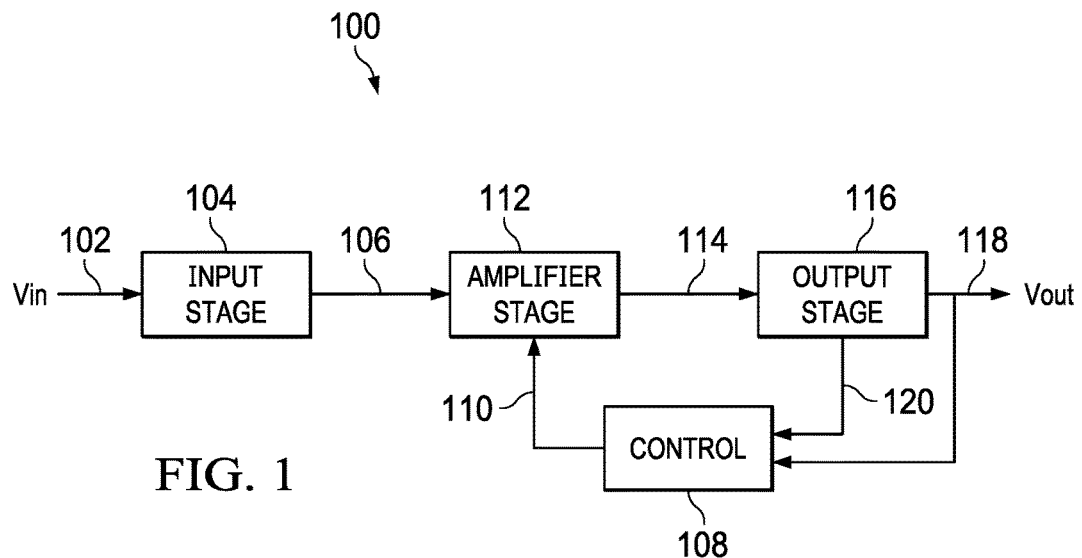
FIG. 1 is a block diagram of a class AB Op-Amp according to some aspects of the present disclosure.

FIG. 1 is a block diagram of an example class AB Op-Amp 100 according to some aspects of the present disclosure. Class AB Op-Amp 100 may include an input stage 104 configured to receive an input 102. Input 102 (Vin) may be, for example, a differential input voltage signal or a single-ended input voltage signal. When input stage 104 is configured to receive a differential input signal, input stage 104 may allow common-mode voltages down to and below the negative supply rail. The input stage 104 provides a drive signal 106.

Input stage 104 is coupled to the amplifier stage 112, which is configured to receive the drive signal 106 and to provide an amplified signal 114 in response to the drive signal 106 and bias signal 110. The amplifier stage 112 may comprise a current mirror with cascodes (not shown) to provide higher output impedance and reduce the effect of Miller capacitance. A current mirror may sum the opposite-phase signals of input 102, when input 102 comprises a differential input signal, in order to drive the gates of the output transistors (not shown) in the output stage 116. In an example, the cascode circuit may be further configured to provide a level shift between the input stage 104 and the output stage 116 by level shifting the drive signal 106 thereby providing a low supply voltage for a low voltage class AB Op-Amp.

In a class AB Op-Amp 100, the output voltage 118 at the output stage 116 may swing from the positive voltage source (or supply rail) ($V_{dd}$) (not shown) to the ground rail ($V_{ss}$) (not shown). The output stage 116 may include two transistors in a push-pull configuration (not shown) to provide the output voltage 118 at the output stage. In an example, the transistors of the output stage 116 may be an N-MOS and a P-MOS transistor.

As shown in FIG. 1, class AB Op-Amp 100 may include control circuit 108 to implement a feedback loop to provide for class AB biasing. For example, control circuit 108 may receive current feedback signal 120 from output stage 116. The current feedback signal 120 may include a current signal for each transistor in the output stage 116. The control circuit 108 may include one or more transistors to sense (or determine) the level (or amount) of each current signal in the current feedback signal 120 from output stage 116. The transistors that sense the current may be arranged to provide a current sense branch in the control circuit 108.

Based on the current feedback signal 120, the control circuit 108 provides the bias signal 110 to the amplifier stage 112 to bias the amplifier stage 112 for class AB operation. This completes the current feedback loop between the amplifier stage 112, the output stage 116, and the control circuit 108. The amplifier stage 112 may comprise a "P-MOS side" that includes P-MOS transistors for providing the amplified signal 114 to the P-MOS output transistor (not shown) in the output stage 116, and the amplifier stage 112 may comprise an "N-MOS side" that includes N-MOS transistors for providing the amplified signal 114 to the N-MOS output transistor (not shown) in the output stage 116. The bias signal 110, which is the feedback, may be applied to either the N-MOS side or the P-MOS side of the amplifier stage 112.

When the output voltage 118 at the output stage 116 is outside the linear range, the current feedback loop can become dysfunctional. For example, if feedback is applied to the N-MOS side of the amplifier stage 112, the feedback loop may become dysfunctional as the output voltage 118 approaches ground. In another example, if feedback is applied to the P-MOS side of the amplifier stage 112, the feedback loop may become dysfunctional when the output voltage 118 approaches the positive voltage supply rail.

This dysfunction in the current feedback loop causes the quiescent current on the current sense branch in the control circuit 108 to go high due to the gain of the Op-Amp being low. For example, when the output voltage 118 approaches ground, the gate of the N-MOS transistor in the output stage 116 approaches the positive supply voltage. Alternatively, when the output voltage 118 approaches the positive supply voltage, the gate of the P-MOS transistor in the output stage 116 approaches ground. In either case, this causes the current on the current sense branch in control circuit 108 to increase beyond the value when the class AB Op-Amp 100 is within its linear range, even in the no load scenario. This high current on the current sense branch is inefficient and can generate excess heat.

To address the above situations, in some examples (and as explained in more detail below), the control circuit 108 includes circuitry to limit the high quiescent current on the current sense branch of the feedback loop. The control circuit 108 may include a voltage clamp configured to sense the output voltage 118 from output stage 116. A voltage clamp may comprise a diode connected transistor or other suitable components to sense the output voltage 118. The voltage clamp generates a gate voltage proportional to the output voltage 118. In some examples, the gate voltage is coupled to the gate of a current limiting transistor configured to limit the current in the sense branch in the control circuit 108. The current limiting transistor may limit the current when the Op-Amp is operating in the non-linear region, but the voltage clamp may reduce or not limit the current in the sense branch when the Op-Amp is operating in the linear range. A further description of the above circuit elements is set forth below.

Figure 2:
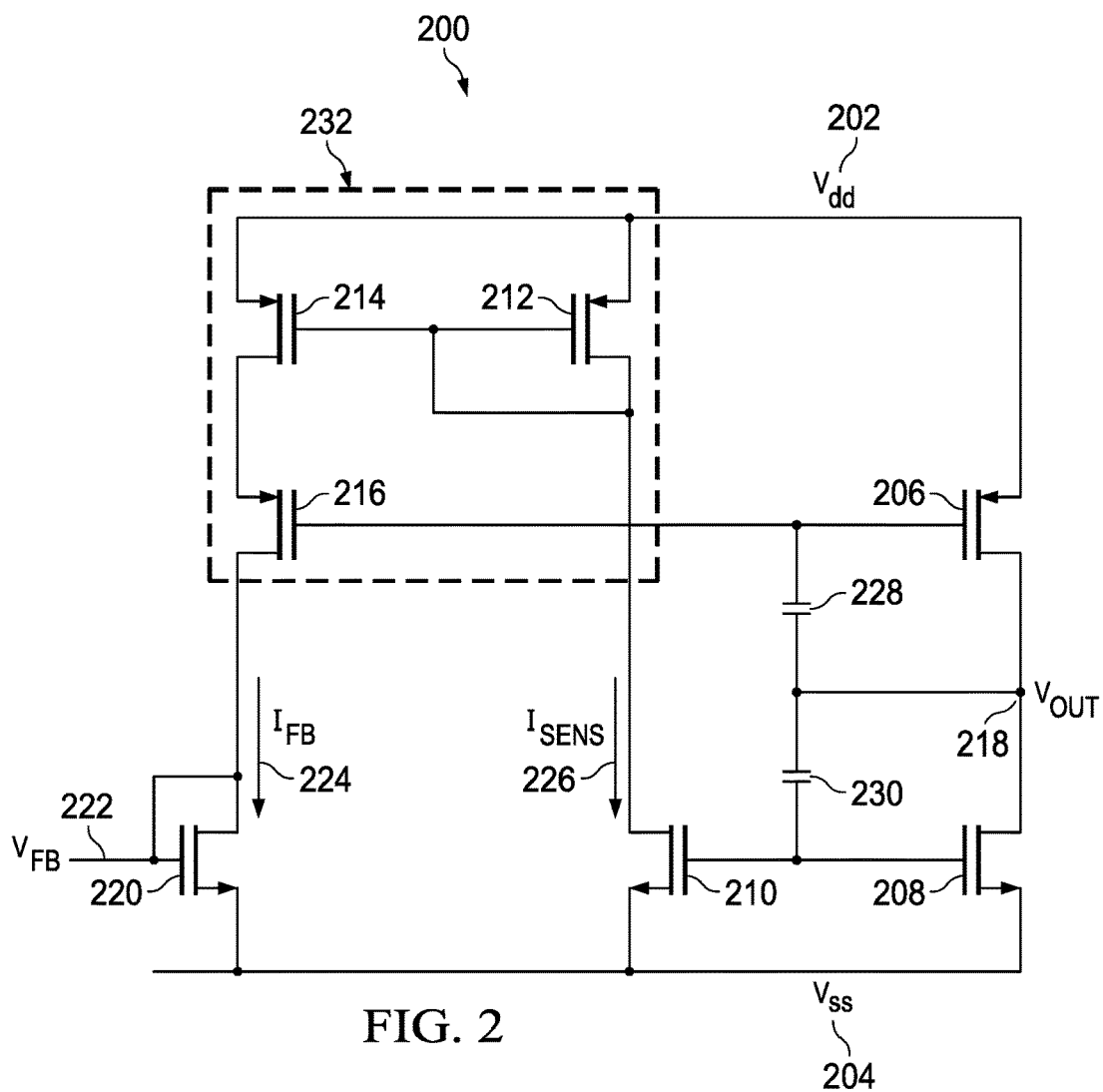
FIG. 2 is a circuit diagram of the control circuit and output stage of a low voltage class AB Op-Amp in which the feedback loop is on the N-MOS side of the amplifier stage.

FIG. 2 is a circuit diagram of the control circuit and output stage of a low voltage class AB Op-Amp in which the feedback loop is on the N-MOS side of the amplifier stage. Circuit 200 discloses an output stage comprising P-MOS output transistor 206 and N-MOS output transistor 208, capacitors 228 and 230, and voltage output (Vout) 218. The drain of transistor 206 is coupled to the drain of output transistor 208. Voltage output Vout 218 is located on the drains of output transistors 206 and 208. Capacitors 228 and 230 are coupled in series between the gate of output transistor 206 and the gate of output transistor 208, and capacitors 228 and 230 may be referred to as Miller capacitors. Miller capacitors 228 and 230 provide compensation for the Miller effect, which is an increase in the equivalent input capacitance to output transistors 206 and 208 in the output stage.

The portion of circuit 200 comprising the control circuit includes N-MOS transistors 210 and 220, and P_MOS transistors 216, 212, and 214. Transistors 216, 212, and 214 form current selector 232 that is part of a current feedback loop driving the amplifier stage to obtain class AB biasing. Current selector 232 is configured to output the lesser of two currents, and current selector 232 may be referred to as a minimum current selector.

The gate of transistor 216 in current selector 232 is coupled to the gate of transistor 206 in the output stage, which enables transistor 216 to measure (or function as a current sensor of) the current associated with transistor 206. Transistor 216 senses the current associated with transistor 206 because as the output current in transistor 206 changes, a change in gate voltage will occur. Because the gates of transistors 216 and 206 are coupled together, the gate voltage at transistor 216 will change proportionally as the gate voltage of transistor 206 changes, thus enabling transistor 216 to measure (or function as a current sensor of) the current output of transistor 206.

In current selector 232, the drain of transistor 216 is coupled to the source of transistor 220. The source of transistor 216 is coupled to the drain of transistor 214. The source of transistor 214 is coupled to the positive power rail 202. The gate of transistor 214 is coupled to the gate of transistor 212, and the source of transistor 212 is also coupled to the positive power rail 202. Transistor 212 may be configured in a diode configuration (or "diode-connected transistor") in which the gate of transistor 212 is coupled to the drain of transistor 212. The drain of transistor 212 is also coupled to the drain of transistor 210. The source of transistor 210 is coupled to the ground rail 204. The gate of transistor 210 is coupled to the gate of output transistor 208 enabling transistor 210 to measure (or function as a current sensor of) the current associated with output transistor 208 in a similar fashion as described above with respect to transistors 216 and 206.

The current selector 232 determines the lesser of two currents: current associated with output transistor 206 and current associated with output transistor 208. The output of current selector 232 is feedback current $I_{FB}$ 224, which is the lesser of the two currents. The feedback current $I_{FB}$ 224 runs through transistor 220, which is configured as a diode connected transistor by having the source and gate of transistor 220 coupled together. The feedback current $I_{FB}$ 224 through the diode connected transistor 220 provides for bias feedback voltage $V_{FB}$ 222 that biases (in class AB mode) the amplifier stage 112 discussed with respect to FIG. 1 above.

The operation of the current feedback loop will now be explained with respect to FIGS. 1 and 2. The amplifier stage 112 receives the bias signal 110 (which comprises bias feedback voltage $V_{FB}$ 222), and the amplifier stage 112 adjusts the output based on the bias feedback voltage $V_{FB}$ 222.

The bias feedback voltage $V_{FB}$ 222 is based on the feedback current $I_{FB}$ 224 at transistor 220, which is configured as a diode connected transistor. Feedback current $I_{FB}$ 224 may be determined by current selector 232, which selects the lesser of two currents. Current selector 232 comprises transistors 212, 214, and 216. In the current feedback loop, the current selector 232 operates to maintain a minimum current in output transistors 206 and 208 to prevent turn-on delay and thus crossover distortion.

The current selector 232 outputs the lesser of two currents: current associated with output transistor 206 and current associated with output transistor 208. When output transistor 206 delivers a large output of current, its gate-source voltage will be large, and the voltage between the positive supply rail ($V_{dd}$) 202 and the source of transistor 216 operates transistor 214 in saturation. When transistor 214 operates in saturation, transistors 214, 216, and 212 function as a cascoded current mirror to mirror the current of transistor 210 to feedback current $I_{FB}$ 224 through transistor 220. Thus, the current selector 232 outputs the lesser of the currents associated with output transistors 206 and 208, and the bias feedback voltage $V_{FB}$ 222 is based on the current associated with output transistor 208, which is lower than the current associated with output transistor 206.

Conversely, when output transistor 208 delivers a large output current, transistor 214 operates in the linear range and pulls the source of transistor 216 high into saturation. Transistor 216 now mirrors the current of output transistor 206, which is small in comparison to the output current of output transistor 208. Thus, the output (feedback current $I_{FB}$ 224) of current selector 232 via transistor 216 is the lesser of the currents associated with output transistors 206 and 208, and the bias feedback voltage $V_{FB}$ 222 is based on the current associated with output transistor 206, which is lower than the current associated with output transistor 208.

The sense branch of the control circuit is between transistor 212 and 210, and $I_{SENS}$ current 226 represents the current on the sense branch.

When the output at $V_{O1}$ 218 is outside the linear range (approximately ground (or zero volts)), the $I_{SENS}$ current 226 on the sense branch between transistor 212 and transistor 210 goes high. This happens because when the amplifier output is close to ground rail 204, the gain of the Op-Amp is low, and the gate voltage of output transistor 208 goes high. The high gate voltage on output transistor 208 causes the gate voltage of transistor 210 to be high, which causes the $I_{SENS}$ current 226 to be high. For example, when the voltage at $V_{01}$ 218 is approximately 110 μV, then a gate voltage of output transistor 208 may be 3.1 V resulting in an $I_{SENS}$ current 226 of approximately 660 μA. Conversely, when the output at $V_{out}$ 218 is within the linear range, then, for example, an output voltage $V_{out}$ 218 of 300 mV may result in a gate voltage of output transistor 208 at 0.7 V and $I_{SENS}$ current 226 to be 3.5 μA. The high $I_{SENS}$ current 226 when operating outside the linear range is inefficient, and in low voltage low power applications, such inefficiency is even more magnified. In addition, extra current causes additional heat.

Figure 3:
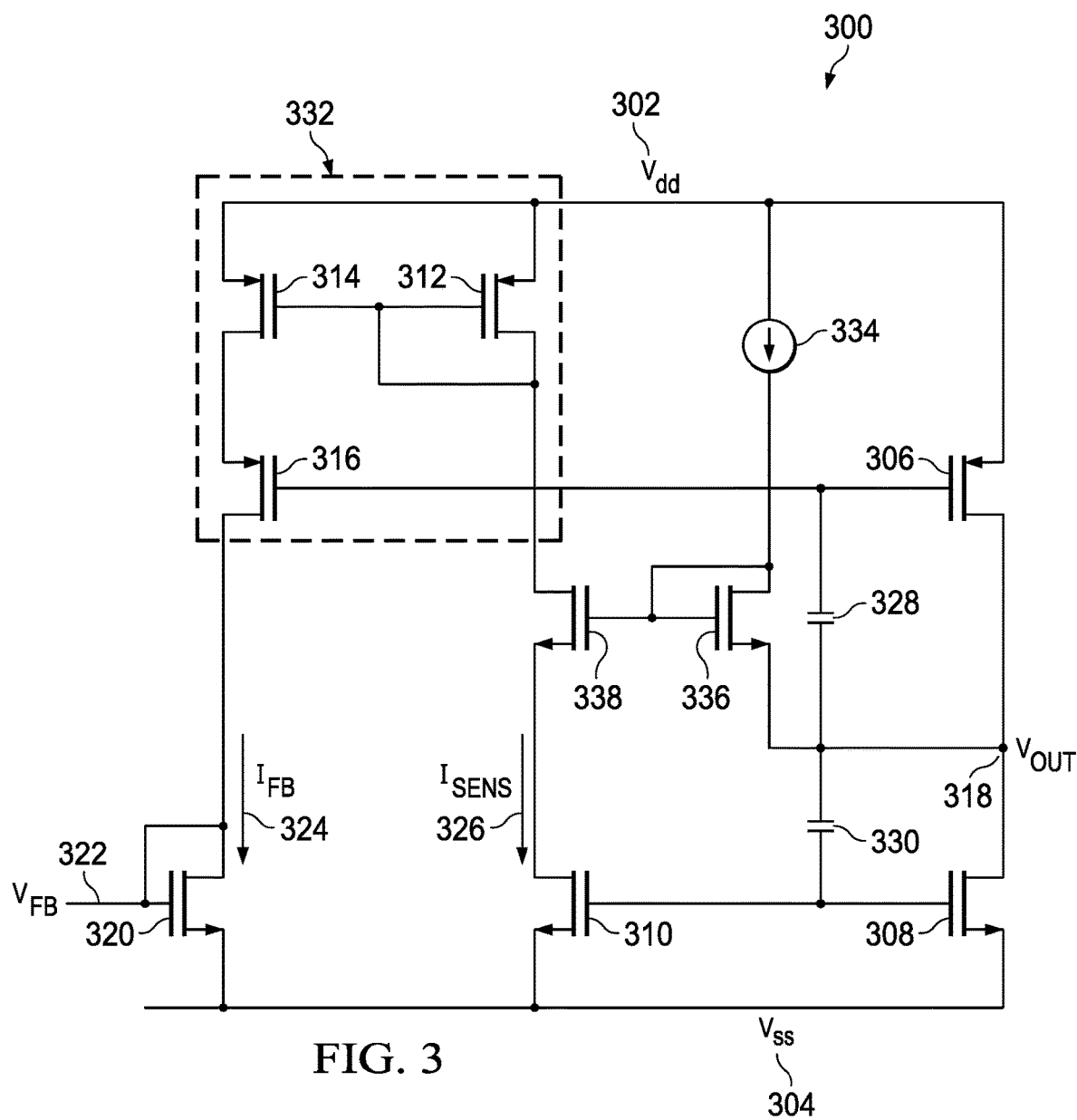
FIG. 3 is a circuit diagram of the control circuit and output stage of a low voltage class AB Op-Amp in which the feedback loop is on the N-MOS side of the amplifier stage, according to some aspects of the present disclosure.

FIG. 3 is a circuit diagram of the control circuit and output stage of a low voltage class AB Op-Amp in which the feedback loop is on the N-MOS side of the amplifier stage, according to some aspects of the present disclosure. In the circuit 300 of FIG. 3, like circuit 200 of FIG. 2, the output stage comprises transistors 306 and 308, Miller capacitors 328 and 330, and output voltage (Vout) 318. The portion of circuit 300 comprising the control circuit includes N-MOS transistors 310 and 320, and P_MOS transistors 316, 312, and 314. Transistors 316, 312, and 314 form current selector 332 that is part of a current feedback loop driving the amplifier stage to obtain class AB biasing. Finally, current source 334, N-MOS transistors 336 and 338 may also be included in the control circuit.

One terminal of current source 334 is coupled to $V_{dd}$ 302, and a second terminal of current source 334 is coupled to the drain of transistor 336. Any suitable equivalent elements that function as a current source are contemplated. In an integrated circuit, current sources may be preferable to other elements because current sources may occupy less area in the integrated circuit than other elements.

Transistor 336 is an N-MOS transistor configured as a diode connected transistor having the gate coupled to the drain. The use of transistor 336 in a diode configuration is an exemplary embodiment. Alternative components are contemplated to provide the function of transistor 336, including but not limited to using one or more diodes. The source of transistor 336 is coupled to output voltage (Vout) 318. The gate of transistor 336 is coupled to the gate of transistor 338. Transistor 338 is an N-MOS transistor. The drain of transistor 338 is coupled to the drain of transistor 312. The source of transistor 338 is coupled to the drain of transistor 310.

In the exemplary configuration of FIG. 3, transistor 336 functions as a voltage clamp to provide a bias voltage on the gate of transistor 338. Transistor 336 is coupled to output voltage (Vout) 318 to sense the output voltage produced by output transistor 308 at output voltage (Vout) 318. Sensing the output voltage may comprise either directly or indirectly measuring the voltage, detecting the voltage, or otherwise receiving an indication of the output voltage. By sensing the output voltage at output voltage (Vout) 318, the voltage on the gate of transistor 336 can track the output voltage at output voltage (Vout) 318. Thus, as the voltage at output voltage (Vout) 318 increases, the voltage at the gate of transistor 336 increases, and because the gate of transistor 336 is coupled to the gate of transistor 338, the voltage at the gate of transistor 338 also increases. Conversely, as the voltage at output voltage (Vout) 318 decreases, the voltage at the gates of transistors 336 and 338 also decreases.

Transistor 338 is biased by transistor 336 to limit the flow of current $I_{SENS}$ 326 on the current sense branch. When the gate voltage at transistor 338 increases, transistor 338 reduces the limitation of current $I_{SENS}$ 326. Conversely, the lower the output voltage at output voltage (Vout) 318, the lower the gate voltage at transistor 338. When the gate voltage at transistor 338 is low, transistor 338 operates to increasingly limit the flow of current $I_{SENS}$ 326.

Current source 334 provides a biasing current for transistor 336, which is acting as the voltage clamp. Current source 334 biases transistor 336 to enable transistor 336 to provide a gate voltage to transistor 338 to bias transistor 338 to limit current $I_{SENS}$ 326. With current source 334 provided to transistor 336, when output voltage (Vout) 318 is approximately zero volts (or ground), transistor 338 will be biased by current source 334 to resist the flow of current $I_{SENS}$ 326 in the current sense branch. Thus, the voltage clamp is configured to bias transistor 338 based on current source 334 and the sensed output voltage at output voltage (Vout) 318.

As an example, if the voltage at output voltage (Vout) 318 is low at approximately 25 μV, then a gate voltage of 308 may be 3.1 V. In the example of FIG. 3, the current $I_{SENS}$ 326 is limited by transistor 338, and the resulting current $I_{SENS}$ 326 may be 10.8 μA. A current value in the sense branch of 10.8 μA is significantly lower than the current value in the sense branch 226 of FIG. 2 in which there is no current limiting. As set forth above in an example with respect to FIG. 2, when the output voltage $V_{out}$ 218 is low (110 μV), the current in the sense branch 226 will be significantly higher at 660 μA. Returning to FIG. 3, because transistor 336 tracks the output voltage at output voltage (Vout) 318, the limitation of current decreases as the output voltage at output voltage (Vout) 318 goes up to prevent current $I_{SENS}$ 326 from being overly limited. For example, if the output at output voltage (Vout) 318 is 300 mV, the gate voltage of 308 may be 0.7 V and current $I_{SENS}$ 326 may be 3.3 μA. As this example demonstrates, the disclosed embodiments help reduce wasted current outside the linear range.

Furthermore, because the exemplary embodiment tracks the output voltage (Vout) 318, the exemplary embodiment does not interfere with the feedback loop of the class AB Op-Amp. For example, when the output transistor 308 delivers a large output current, the current $I_{SENS}$ 326 will go high (and will be limited), but transistor 338 is biased by current source 334 and transistor 336 so as to not overly limit $I_{SENS}$ 326 such that it is smaller than the current associated with transistor 306. Therefore, current selector 332 will output to transistor 320 (as current $I_{FB}$ 324) the current associated with output transistor 306 because the current associated with transistor 306 will be the lesser of the currents associated with transistors 306 and 308. Thus, the bias feedback voltage $V_{FB}$ 322 which is based on current $I_{FB}$ 324 is not affected by the limitation to current $I_{SENS}$ 326.

Conversely, when the output transistor 306 delivers a large output current, the current $I_{SENS}$ 326 will be low because it is associated with output transistor 308. As the current $I_{SENS}$ 326 is the low current (as between the currents associated with transistors 306 and 308), the current selector 332 will select the current $I_{SENS}$ 326 to be provided as current $I_{FB}$ 324 to transistor 320 to provide the bias feedback voltage $V_{FB}$ 322. The current $I_{SENS}$ 326 value in circuit 300 will not interfere with the determination of the bias feedback voltage $V_{FB}$ 322 because current $I_{SENS}$ 326 will have little to no current limiting by transistor 338 as output voltage output voltage (Vout) 318 will be high causing the voltage clamp to provide a high gate voltage to transistor 338, which will reduce or eliminate any current limiting of current $I_{SENS}$ 326. Thus, in either case, the disclosed embodiments do not interfere with the feedback loop and the determination of the bias feedback voltage $V_{FB}$ 322.

Figure 4:
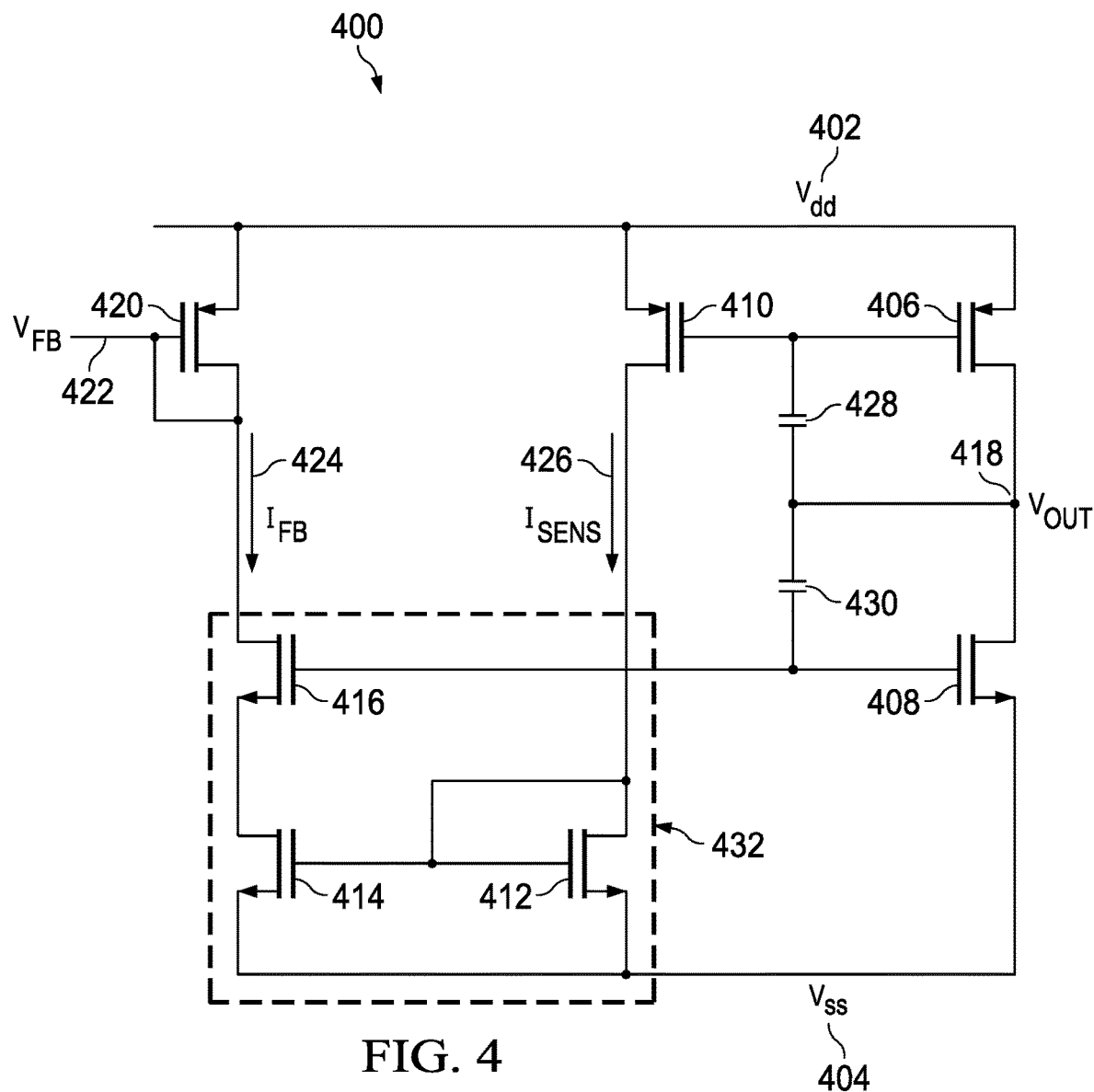
FIG. 4 is a circuit diagram of the control circuit and output stage of a low voltage class AB Op-Amp in which the feedback loop is on the P-MOS side of the amplifier stage.

FIG. 4 is a circuit diagram of the control circuit and output stage of a low voltage class AB Op-Amp in which the feedback loop is on the P-MOS side of the amplifier stage. When the feedback is on the P-MOS side of the amplifier stage, high current in current $I_{SENS}$ 426 will occur when the output at output voltage Vout 418 is approximately the positive supply $V_{dd}$ 402. The current feedback loop is illustrated in FIG. 4. The output stage comprises P-MOS transistor 406 and N-MOS transistor 408, Miller capacitors 428 and 430, and output voltage Vout 418. The drain of transistor 406 is coupled to the drain of transistor 408. Output voltage Vout 418 is located on the drains of transistors 406 and 408. Capacitors 428 and 430 are Miller capacitors coupled in series between the gate of transistor 406 and the gate of transistor 408.

The portion of circuit 400 comprising the control circuit includes P-MOS transistors 410 and 420, and N_MOS transistors 416, 412, and 414. Transistors 416, 412, and 414 form current selector 432 that is part of a current feedback loop driving the amplifier stage to obtain class AB biasing. Current selector 432 is configured to output the lesser of a current associated with transistor 406 and a current associated with transistor 408. The output of current selector 432 is feedback current $I_{FB}$ 424 through diode connected transistor 420, which provides the bias feedback voltage $V_{FB}$ 422 that biases the class AB amplifier stage 112 discussed with respect to FIG. 1 above. The amplifier stage receives bias feedback voltage $V_{FB}$ 422, and the amplifier stage adjusts the output based on the bias feedback voltage $V_{FB}$ 422.

The function of current selector 432 will now be explained. When output transistor 408 delivers a large output of current, its gate-source voltage will be large, and the voltage between ground 404 and the source of transistor 416 operates transistor 414 in saturation. When transistor 414 operates in saturation, transistors 416, 414, and 412 function as a cascoded current mirror to mirror the current of measuring transistor 410 to transistor 420 that outputs bias feedback voltage $V_{FB}$ 422 based on the lower output current associated with output transistor 406.

Conversely, when output transistor 406 delivers a large output current, transistor 414 operates in the linear range and pulls the source of 416 high into saturation. Transistor 416 now mirrors the current of output transistor 408, which is small in comparison to the output current of transistor 406. Thus, the output (current $I_{FB}$ 424) of current selector 432 via transistor 416 is the lesser of the currents associated with transistors 406 and 408, and the bias feedback voltage $V_{FB}$ 422 is based on the current associated with output transistor 408, which is lower than the current associated with output transistor 406.

Current $I_{SENS}$ 426 represents the current on the sense branch of the control circuit which is between transistor 412 and 410.

In the circuit 400 of FIG. 4, when the output at output voltage Vout 418 is outside the linear range (approximately positive supply $V_{dd}$ 402), current $I_{SENS}$ 426 goes high. This happens because when the amplifier output is close to positive supply $V_{dd}$ 402, the gain of the Op-Amp is low, and the gate voltage of transistor 406 goes low. The low gate voltage on transistor 406 causes the gate of transistor 410 to be low, which causes current $I_{SENS}$ 426 to go high. For example, if the voltage at output voltage Vout 418 is approximately 3.3 V, then a gate voltage of transistor 406 may be 0.2 V and may cause a current $I_{SENS}$ 426 of 600 μA. As with the examples associated with FIG. 2, the high current $I_{SENS}$ 426 that may occur when the Op-Amp is operating outside the linear range is inefficient, and in low voltage low power applications, such inefficiency is even more magnified. In addition, extra current causes additional heat.

Figure 5:
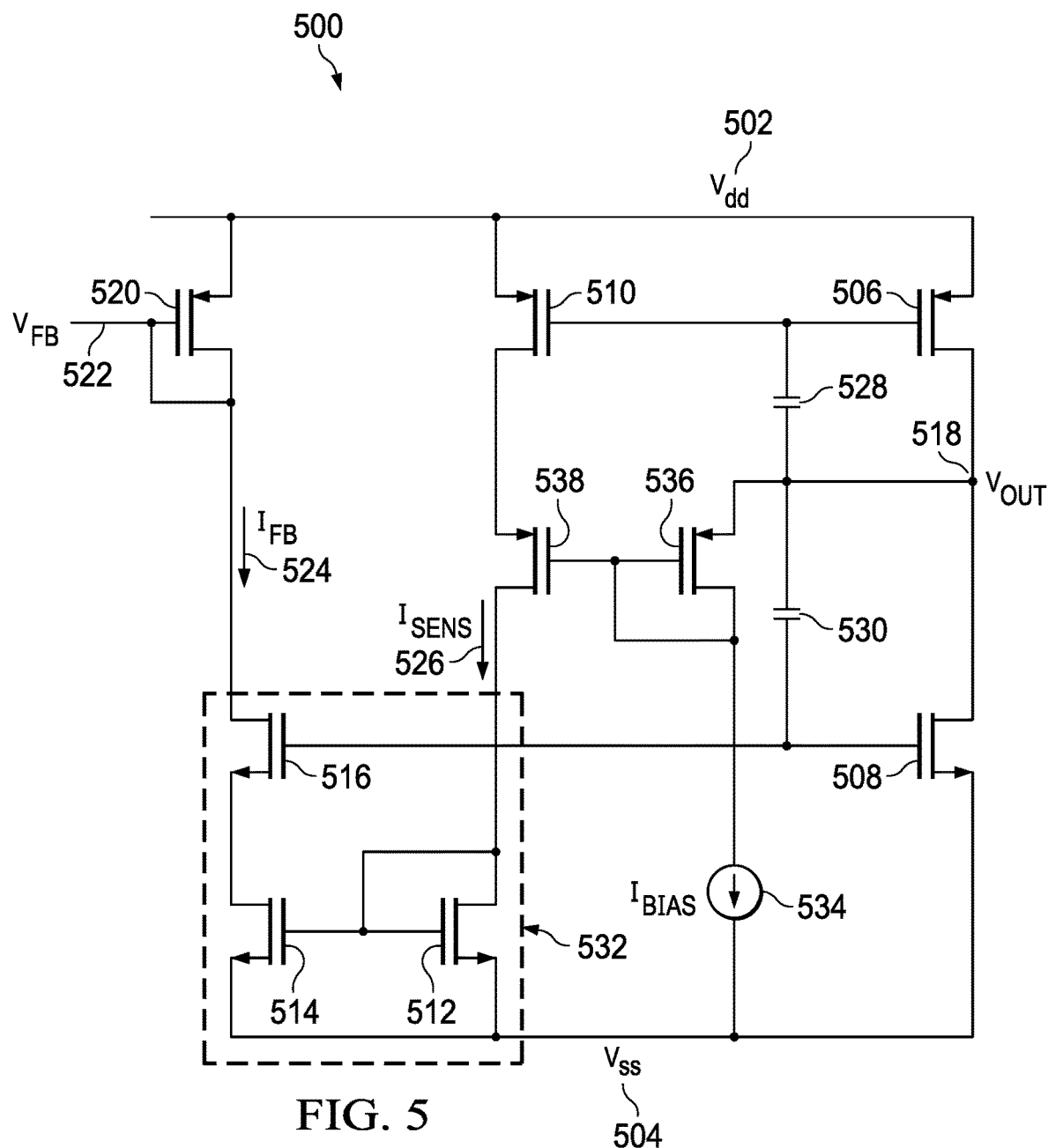
FIG. 5 is a circuit diagram of the control circuit and output stage of a low voltage class AB Op-Amp in which the feedback loop is on the P-MOS side of the amplifier stage, according to some aspects of the present disclosure.

FIG. 5 is a circuit diagram of the control circuit 108 and output stage 116 of a low voltage class AB Op-Amp in which the feedback loop is on the P-MOS side of the amplifier stage 112, according to some aspects of the present disclosure. In addition to the elements disclosed in FIG. 4, FIG. 5 incorporates a current source 534 coupled to $V_{ss}$ 504 on one terminal of current source 534, and a second terminal of current source 534 is coupled to the drain of transistor 536. Any suitable equivalent components that function as a current source are contemplated.

Transistor 536 is a P-MOS transistor configured as a diode connected transistor having its gate coupled to its drain. Alternative components are contemplated to provide the function of transistor 536, including but not limited to using one or more diodes. The source of transistor 536 is coupled to output voltage $V_{out}$ 518. The gate of transistor 536 is coupled to the gate of transistor 538. Transistor 538 is a P-MOS transistor. The drain of transistor 538 is coupled to the drain of transistor 512. The source of transistor 538 is coupled to the drain of transistor 510.

In the exemplary configuration of FIG. 5, transistor 536 may function as a voltage clamp to provide a voltage to bias transistor 538. Transistor 536 is coupled to output voltage $V_{out}$ 518 to sense the output voltage $V_{out}$ 518. By sensing the output voltage $V_{out}$ 518, the voltage on the gate of transistor 536 can track the output voltage $V_{out}$ 518. Thus, as the output voltage $V_{out}$ 518 increases, the voltage at the gate of transistor 536 increases, and because the gate of transistor 536 is coupled to the gate of transistor 538, the voltage at the gate of transistor 538 increases. Conversely, as the output voltage $V_{out}$ 518 decreases, the voltage at the gates of transistors 536 and 538 also decreases.

Transistor 538 is biased by transistor 536 to limit the flow of current $I_{SENS}$ 526 on the current sense branch. When the gate voltage at transistor 538 increases, transistor 538 increases the limitation of current $I_{SENS}$ 526. Conversely, the lower the output voltage $V_{out}$ 518, the lower the gate voltage at transistor 538. When the gate voltage at transistor 538 is high, transistor 530 operates to increasingly limit the flow of current $I_{SENS}$ 526.

Current source 534 biases transistor 536, which is acting as the voltage clamp. The current source 534 biases transistor 536 to enable transistor 536 to provide a gate voltage to transistor 538 to bias transistor 538 to limit current $I_{SENS}$ 526. Thus, transistor 536 is configured to bias transistor 538 based on current source 534 and the sensed output voltage $V_{out}$ 518.

Referring back to the example discussed with respect to FIG. 4, if the output voltage $V_{out}$ 518 is approximately 3.3 V, then a gate voltage at 506 may be low at approximately 0.2 V. In the example circuit 500 of FIG. 5, the current $I_{SENS}$ 526 is limited by transistor 538, and the resulting current $I_{SENS}$ 526 may be approximately 10 μA, which is lower than the 600 μA on the $I_{SENS}$ 426 branch in FIG. 4 without the current limiting configuration of FIG. 5. Because the voltage clamp tracks the output voltage $V_{out}$ 518, the limitation of current $I_{SENS}$ 526 in the current sense branch decreases as the output voltage $V_{out}$ 518 goes down to prevent current $I_{SENS}$ 526 from being overly limited.

The exemplary embodiment does not interfere with the feedback loop of the class AB Op-Amp. For example, when the output transistor 506 delivers a large output current, the current $I_{SENS}$ 526 is high. While transistor 538 will limit the current $I_{SENS}$ 526, it does not affect the current feedback circuit generating bias feedback voltage $V_{FB}$ 522 because the bias feedback voltage $V_{FB}$ 522 will not be based on the current $I_{SENS}$ 526. When transistor 506 delivers a large output current, transistor 508 will be producing a smaller output. Thus, the current selector 532 will output (as $I_{FB}$ 524) the current associated with output transistor 508 as the minimum current to transistor 520 for producing bias feedback voltage $V_{FB}$ 522.

Conversely, when the output transistor 508 delivers a large output current, output transistor 506 will be associated with the smaller current output. Thus, the current $I_{SENS}$ 526 will be the low current output (as current $I_{FB}$ 524) by current selector 532 because it is associated with output transistor 506, and the bias feedback voltage $V_{FB}$ 522 will be determined based on the current $I_{SENS}$ 526. In the exemplary embodiment of FIG. 5, the current $I_{SENS}$ 526 will not affect the functioning of the current feedback loop when selected because the current $I_{SENS}$ 526 will not be limited or have a very small limitation. This is because the voltage at output voltage $V_{out}$ 518 will be low causing transistor 536 to provide a low gate voltage to transistor 538, which will reduce or eliminate any current limiting of current $I_{SENS}$ 526. Thus, in either case, the disclosed embodiments do not interfere with the feedback loop.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Circuits 300 and 500 or other integrated circuit devices may use any combination of dedicated hardware and instructions stored in a non-transitory medium. Accordingly, elements of circuits 300 and 500 may include a processing resource coupled to a non-transitory computer-readable medium. The processing resource may include one or more microcontrollers, ASICs, CPUs, GPUs, and/or other processing resources configured to execute instructions stored on the medium. Examples of suitable non-transitory computer-readable media include one or more flash memory devices, battery-backed RAM, SSDs, HDDs, optical media, and/or other memory devices suitable for storing the instructions for the processing resource.

It is understood that the present disclosure provides a number of exemplary embodiments and that modification are possible to these embodiments. Such modifications are expressly within the scope of this disclosure. Furthermore, application of these teachings to other environments, applications, and/or purposes is consistent with and contemplated by the present disclosure.

What is claimed is:

1. A circuit comprising:
a first transistor having a control terminal and a first current terminal coupled together;
a current source coupled to the first current terminal of the first transistor;
a second transistor having a first terminal coupled to a second current terminal of the first transistor and to an output voltage node;
a third transistor having a control terminal coupled to the control terminal of the first transistor; and
a fourth transistor having a first current terminal coupled to a first current terminal of the third transistor and a control terminal of the fourth transistor is coupled to a control terminal of the second transistor.

2. The circuit of claim 1, wherein:
the first, second, third, and fourth transistors comprise N-MOS transistors.

3. The circuit of claim 1, wherein:
the first, second, third, and fourth transistors comprise P-MOS transistors.

4. The circuit of claim 2, further wherein:
the current source is coupled to a voltage source.

5. The circuit of claim 3, wherein:
the current source is coupled to a ground.

6. The circuit of claim 1, further comprising:
a fifth transistor having a first current terminal coupled to the first current terminal of the second transistor.

7. The circuit of claim 6, further comprising:
a current selector coupled to the fifth transistor and the third transistor, wherein the current selector includes three transistors.

8. The circuit of claim 7, further comprising:
a sixth transistor having a first current terminal coupled to the current selector.

9. An electronic device comprising:
a current source;
a first transistor coupled to the current source and an output voltage terminal;
a second transistor coupled to the first transistor in series;
a third transistor coupled to the first transistor;
a fourth transistor coupled to the second transistor and coupled in series with the third transistor, wherein the third transistor is configured to limit a first current between the third transistor and the fourth transistor based on an output voltage at the output voltage terminal;
a fifth transistor; and
a current selector coupled with the third transistor and the fifth transistor and configured to control a feedback voltage.

10. The electronic device of claim 9, wherein:
the first, second, third, and fourth transistors comprise N-MOS transistors.

11. The electronic device of claim 9, wherein:
the first, second, third, and fourth transistors comprise P-MOS transistors.

12. The electronic device of claim 9, further comprising:
a sixth transistor having a current terminal coupled to an output of the current selector and a feedback voltage terminal at which the feedback voltage is present;
wherein the current selector is configured to output as a control current a lesser of the first current which is associated with the second transistor and a second current associated with the fifth transistor.

13. The electronic device of claim 9, wherein:
the first transistor comprises a diode configuration, wherein a gate of the first transistor is coupled to a drain of the first transistor.

14. The electronic device of claim 12, wherein:
the current selector includes:
a seventh transistor coupled to the third transistor, wherein a gate of the seventh transistor is coupled to a drain of the seventh transistor;
an eighth transistor, wherein a gate of the eighth transistor is coupled to the gate of the seventh transistor; and
a ninth transistor coupled to the eighth transistor.

15. An amplifier, comprising:
an output stage including a first controlled element associated with a first current and a second controlled element associated with a second current, the output stage configured to provide an output voltage; and
a control circuit coupled to the output stage, the control circuit configured to provide a bias signal, wherein the control circuit includes:
 a current source;
 a voltage sensor coupled to the current source, the voltage sensor configured to sense the output voltage; and
 a current limiter coupled to the voltage sensor, the current limiter configured to limit the first current based on the output voltage.

16. The amplifier of claim 15, wherein the control circuit includes:
a current selector coupled to the current limiter, wherein the current selector is configured to sense the first current.

17. The amplifier of claim 16, wherein:
the first controlled element includes a first transistor and the second controlled element includes a second transistor, the first and second transistors coupled to form an output at which the output voltage is provided.

18. The amplifier of claim 17, wherein:
the current selector is configured to output, as a control current, a lesser of the first current and the second current; and
the bias signal is based on the control current that is output from the current selector.

19. The amplifier of claim 15, wherein:
the voltage sensor includes a transistor in a diode configuration, wherein a gate of the transistor is coupled to a drain of the transistor.

20. The amplifier of claim 17, wherein:
the voltage sensor is configured to bias the current limiter to increase limitation of the first current based on a corresponding increase in the output voltage.

* * * * *